United States Patent
Pathak et al.

(10) Patent No.: US 7,158,727 B2
(45) Date of Patent: Jan. 2, 2007

(54) 10 GBIT/SEC TRANSMIT STRUCTURE WITH PROGRAMMABLE CLOCK DELAYS

(75) Inventors: Vijay Kumar Pathak, San Jose, CA (US); Bharadwaj Parthasarathy, Plano, TX (US); Srinath Devalapalli, Sachse, TX (US)

(73) Assignee: Texas Instruments Incorporated, Dallas, TX (US)

( * ) Notice: Subject to any disclaimer, the term of this patent is extended or adjusted under 35 U.S.C. 154(b) by 678 days.

(21) Appl. No.: 10/256,821

(22) Filed: Sep. 27, 2002

(65) Prior Publication Data

US 2004/0228636 A1  Nov. 18, 2004

Related U.S. Application Data

(60) Provisional application No. 60/340,207, filed on Dec. 12, 2001.

(51) Int. Cl.
*H04B 10/00* (2006.01)
(52) U.S. Cl. ...................................... 398/155; 398/154
(58) Field of Classification Search ................ 398/163, 398/155, 154; 375/316
See application file for complete search history.

(56) References Cited

U.S. PATENT DOCUMENTS

| | | | | |
|---|---|---|---|---|
| 5,946,456 A | * | 8/1999 | Nakamura | 358/1.12 |
| 6,044,122 A | * | 3/2000 | Ellersick et al. | 375/360 |
| 6,166,572 A | * | 12/2000 | Yamaoka | 327/149 |
| 6,188,692 B1 | * | 2/2001 | Huscroft et al. | 370/395.51 |
| 6,704,908 B1 | * | 3/2004 | Horan et al. | 716/1 |
| 6,728,492 B1 | * | 4/2004 | Baroncelli | 398/154 |
| 2002/0105386 A1 | * | 8/2002 | Shastri | 331/11 |
| 2003/0038681 A1 | * | 2/2003 | Djafari et al. | 331/1 A |

* cited by examiner

*Primary Examiner*—Kenneth Vanderpuye
*Assistant Examiner*—Ken Malkowski
(74) *Attorney, Agent, or Firm*—Robert D Marshall, Jr.; W. James Brady; Frederick J. Telecky, Jr.

(57) ABSTRACT

The present invention provides a robust solution to the task of re-aligning data at the transmit end of a fiber optic or other high performance serial link, and also offers flexibility in the circuit board design approach. A high performance analog phase locked-loop circuit is used to simultaneously provide clock recovery for multiple bit streams. The power dissipation required to perform clock recovery is thereby reduced to a fraction of that required in conventional transmit systems. This analog phase locked loop produces plural phase output signals. An output multiplexer selects one phase for use in electrical to optical conversion.

10 Claims, 4 Drawing Sheets

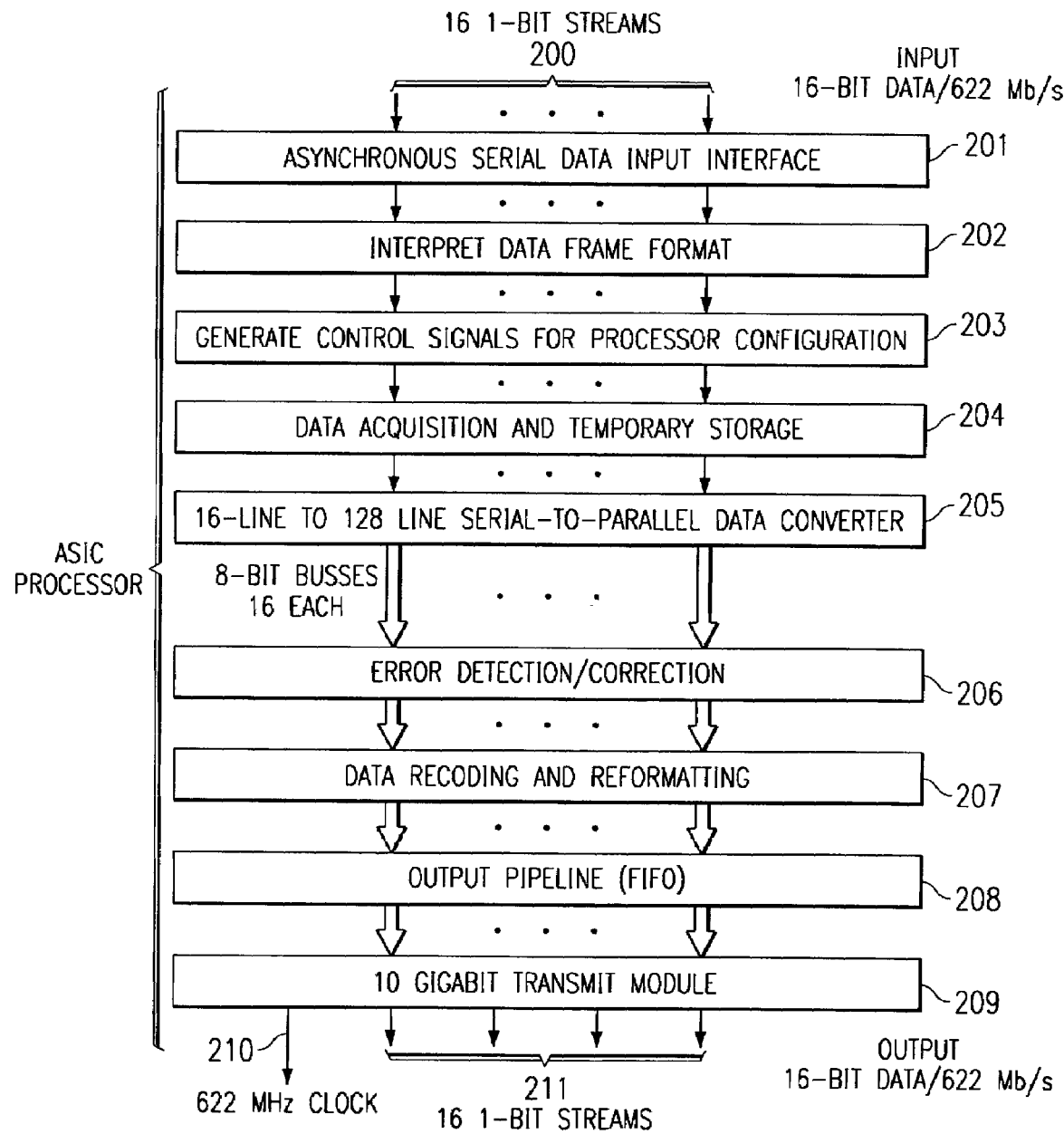

10 GBIT/SEC TRANSMIT STRUCTURE WITH PROGRAMMABLE CLOCK DELAYS

This application claims priority under 35 USC §119(e)(1) of Provisional Application No. 60/340,207, filed Dec. 12, 2001.

TECHNICAL FIELD OF THE INVENTION

The technical field of this invention is repeaters in high speed data transmission.

BACKGROUND OF THE INVENTION

Data transmission at extremely high rates is conventionally carried out by means of serial data streams arranged into packets or frames. Fiber Optic line transmission is becoming increasingly popular at rates of 10 G bits/sec and above.

Conversion and realignment of Sonet OC-192 based standard data streams at 10 Gbit/sec from optical to electrical and then back to optical is an essential part of the process of realizing any high-speed switch fabric in the optical networking discipline. This is because the optical data signals passed from one location to another suffer attenuation in the transmission lines and must be refreshed at intervals in the transmission. This is done by means of receive-transmit modules referred to as repeaters or alternately serial links. Conventional repeaters include a receiver, a data processor, a clock recovery circuit and a transmitter. The receiver includes an optical-to-electrical converter and first stage serial-to-parallel converter/demultiplexer. The data processor is typically an ASIC chip. This ASIC chip performs a variety of tasks such as error detection and correction, forward error correction re-coding, second stage serial-to-parallel conversion and parallel-to-serial conversion. The clock recovery circuit typically includes bipolar Gallium-Arsenide modules. The transmitter includes an electrical-to-optical converter/multiplexer and an optical fiber line driver.

In conventional systems, discrete clock recovery modules in bipolar Gallium-Arsenide technology are used for repeater modules of high performance requirements. ASIC modules perform only the lower performance functions. The required use of bipolar Gallium-Arsenide technology with ASIC technology in the same repeater represents a technology mismatch and has hindered the growth of transmission bandwidth in optical networks.

FIG. 1 illustrates a common prior art construction of a repeater module. The system illustrated is representative of an OC-48 standard 2.4 Gigabit/second (Gb/s) technology. The repeater includes optical-to-electrical demultiplexer 101, ASIC processor 102, clock/data recovery modules (CDR) 103, 104, 105, and 106, and electrical-to-optical multiplexer 107.

Input data stream 100 and output data stream 109 are both 2.4 Gb/s. Both optical-to-electrical converter 101 and electrical-to-optical converter 108 employ special mixed-signal technology with significant portions of the circuits performing at the 2.4 GHz rate. In optical-to-electrical converter 101, the data is typically sampled at the 2.4 GHz rate and a phase adjustment is made on the sampling clock for optimal data recovery. This requires phase lock loop techniques beyond the scope of this description. An additional result of this synchronization and data recovery is that an output clock 110 is generated for operation of the ASIC processor 102. Serial link modules using the building blocks of FIG. 1 vary markedly by application. If the layout of the serial link module as a whole requires physical routing of the clock over significant interconnect lengths, then clock recovery may be necessary within the functional block receiving that clock.

Special timing requirements in the conventional 2.4 Gb/s rate systems have made plural clock/data recovery elements 103 to 107 necessary. These elements use of discrete Gallium-Arsenide bipolar transistor circuits that dissipate a significant amount of power, on the order of several watts. In conventional designs these specific circuits were not suited to integration with the ASIC processor 102, which is typically constructed of complementary metal oxide semiconductor (CMOS). Thus the power dissipation of such a conventional multi-technology electrical-optical repeater system as well as the technology mismatch limits their large-scale use to increase data bandwidth.

In the conventional optical-to-electrical repeater systems, each of four 622 Mb/s data streams have a companion clock signal. FIG. 1 illustrates two such pairs data 110 and clock 111, and data 120 and clock 121. Clock recovery is carried out in a bit-stream by bit-stream basis, requiring multiple high power dissipation clock recovery circuits.

Optical-to-electrical demultiplexer 101 receives a 2.4 Gb/s rate data stream generated by amplitude modulation of the coherent light carrier in the 1 micron wavelength range. The data at the 2.4 GHz rate is super-imposed on the laser light stimulus to a laser diode. Thus the data 100 could have been generated at the input end of the system or could have been re-generated by an up-stream repeater. In long fiber optic lines repeaters are required at intervals of several miles or tens of miles.

Optical-to-electrical demultiplexer 101 receives a 2.4 Gb/s data stream with native synchronization to a 2.4 GHz modulation source. The 1:4 demultiplexing operation of block 101 noted in FIG. 1 is a by-product of the optical-to-electrical conversion process. This demultiplexing operation uses techniques employed in asynchronous mode transfer ATM systems. Table 1 compares the input/output data rates and internal processing data rate for each of the Sonet standards of interest here.

TABLE 1

| Sonet Standard | Serial Data Rate Input/Output | Parallel Parallel Data Rate Internal Processing |
|---|---|---|
| OC-48 | 2.4 GHz | 150 MHz |
| OC-192 | 10 GHz | 622 MHz |
| OC-768 | 40 GHz | 622 MHz |

The conventional Sonet OC-48 ASIC Processor 102 includes the following functional blocks: asynchronous serial data input interface; data frame format interpreter; control signal generator for processor configuration; data acquisition and temporary storage; serial-to-parallel data convertor from 4-bit data to 32 bit data; data processor for error detection/correction unit, data recoding and reformatting; output pipeline first-in-first-out (FIFO) memory; and transmit module including parallel-to-serial converter from 32-bit data to 4-bit data and four-bit stream serial data output interface.

SUMMARY OF THE INVENTION

The present invention provides a robust solution to the task of re-aligning data in the transmit portion of an optical-electrical-optical repeater system and offers flexibility in the circuit board design approach. A single high performance analog phase locked-loop circuit is used to simultaneously provide clock/data recovery for multiple bit streams. The power dissipation required to perform clock recovery is thereby reduced to a fraction of that required in conventional transmit systems.

This invention relates specifically to the transmit module which includes: a clock recovery circuit having an analog phase-locked loop (APLL) with multiple phase outputs; parallel-to-serial conversion blocks; output buffers with programmable output voltage swings; control logic for selecting frequency multiplication ratio and output phases; and liberal distribution of power and ground pads to assure low inductance, high conductance power feed to the high frequency circuits and to suppress power/ground noise generation in high speed switching elements.

BRIEF DESCRIPTION OF THE DRAWINGS

These and other aspects of this invention are illustrated in the drawings, in which:

FIG. 2 illustrates the high level functional block diagram of the ASIC processor in an improved optical-electrical-optical repeater system for optical data reception-re-transmission in Sonet OC-142 system at 10 Gb/s data rate;

DETAILED DESCRIPTION OF PREFERRED EMBODIMENTS

Figure 1:
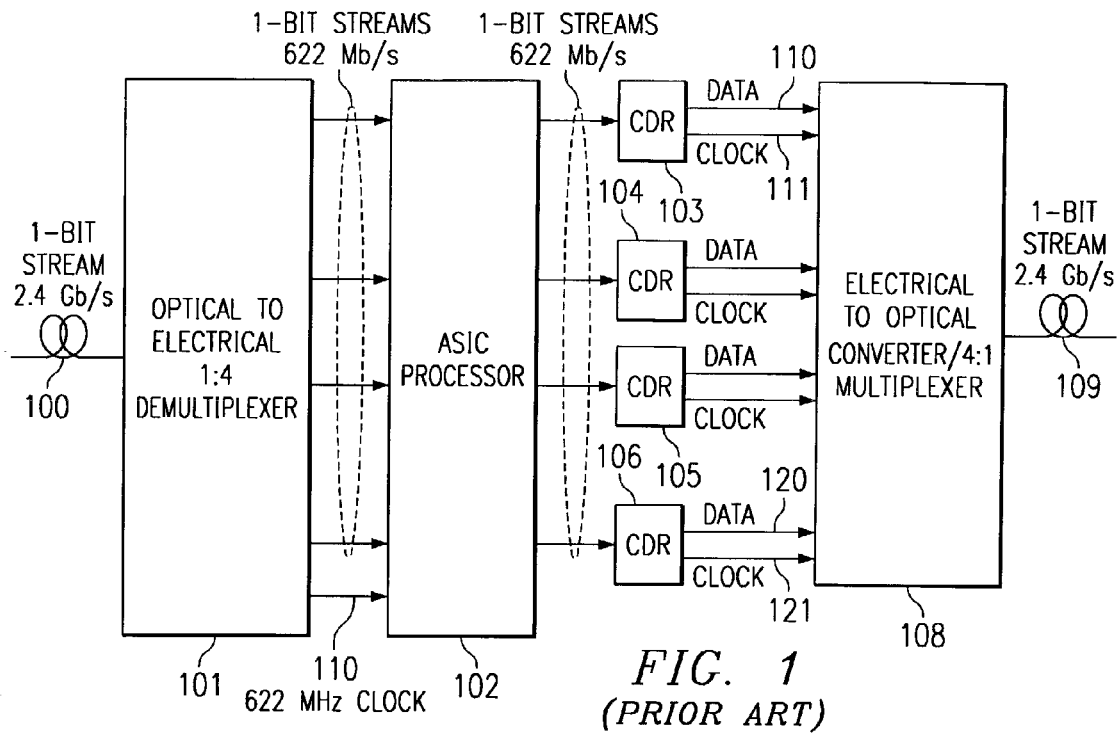
FIG. 1 illustrates the high level functional block diagram of a conventional multi-technology optical-electrical-optical repeater system for optical data reception-re-transmission in Sonet OC-48 system at 2.4 Gb/s data rate (Prior Art)

FIG. 2 illustrates the block diagram of an ASIC processor flow which incorporates the preferred embodiment of the invention, an OC-192 performance level 10 Gb/sec transmit module. At a 10 Gb/sec data stream rate, the optical-to-electrical converter is required to demultiplex by a factor of 16, resulting in 16 1-Bit data streams each at 622 MHz arriving at the input to the ASIC processor. The conventional ASIC processor functions listed earlier are illustrated in FIG. 2 along with the transmit module 209 of this invention. The width of the processor pipeline for the 10 Gb/sec repeater system is four-times larger than that of the conventional 2.4 Gb/s system. The 4-bit wide data stream input of the 2.4 Gb/sec system increases to 16-bits in width. Corresponding to the 32-bit parallel width of the 2.4 Gb/sec system, the parallel width at 10 Gb/sec is 128 bits.

The system uses an all complementary metal oxide semiconductor (CMOS) application specific integrated circuit (ASIC) system processor with the embedded transmit module of this invention. This ASIC system processor integrates high-performance clock circuitry with logic functions. The ASIC processor with transmit module of this invention includes the following parts. Asynchronous serial data input interface 201 receives the 16 1-bit data streams. Interpret data frame format unit 202 locates the data frames in the data. Control signals for processor configuration unit 203 locates and decodes control signals in the data streams. Data acquisition and temporary storage 204 temporarily stores the data. Serial-to-parallel data conversion unit 205 converts the 16-bit data to 128-bit data. Data processing includes error detection/correction unit 206, data recoding and reformatting unit 207 and output pipeline first-in-first-out memory (FIFO) 208. These feed 10 Gbit/s transmit module 209. Transmit module 209 includes parallel-to-serial conversion of 128-bit data to 16-bit data, a sixteen 1-bit streams serial data output interface and a high performance analog phase-locked loop.

Figure 3:
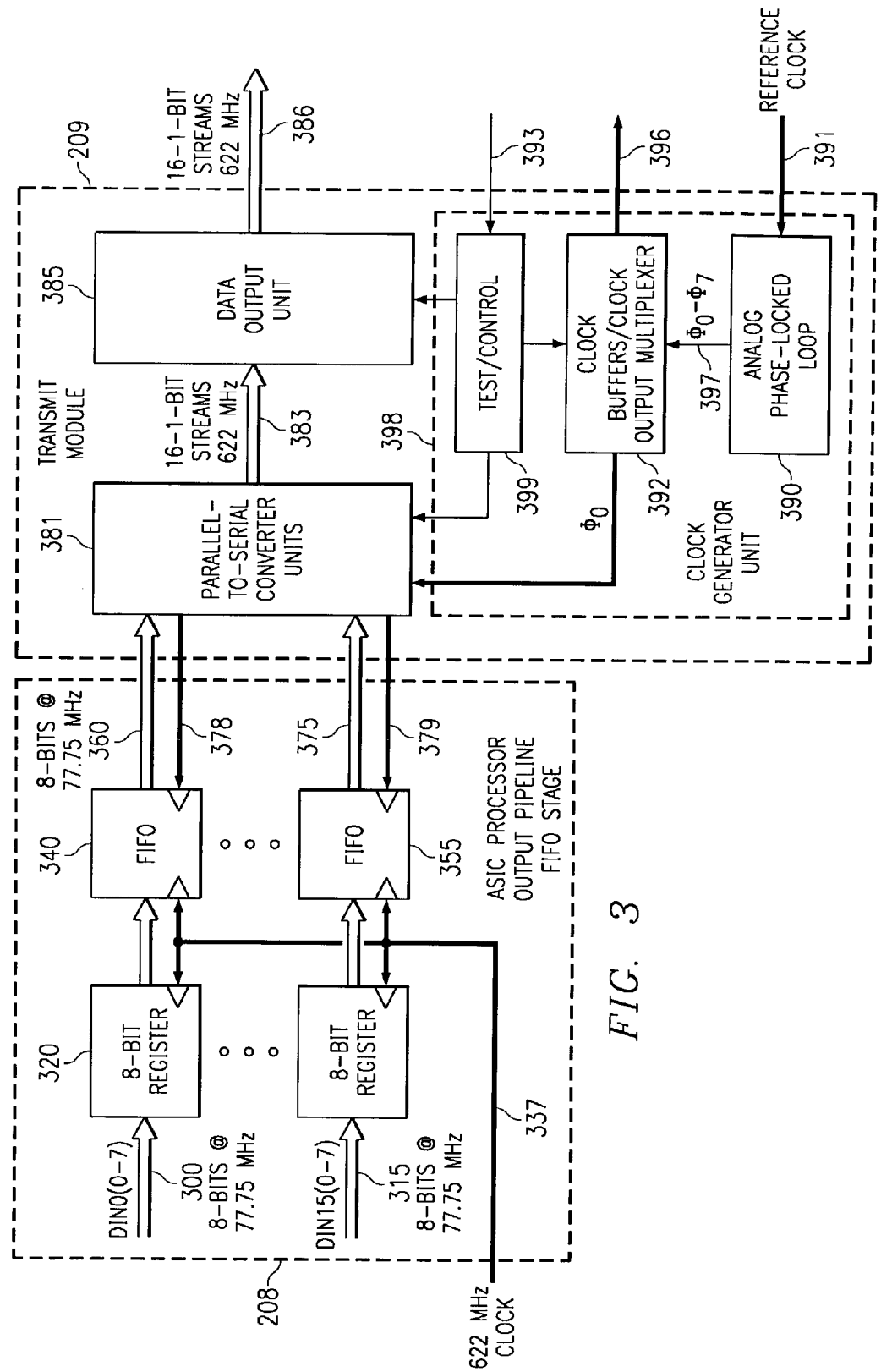
FIG. 3 illustrates the interface of the transmit module of this invention with the output pipeline first-in-first-out memory (FIFO) stages of the ASIC processor core.

FIG. 3 illustrates the interface of the transmit module 209 of this invention with the output pipeline first-in-first-out memory (FIFO) stages 208 of the ASIC processor core. Sixteen busses of 8-bit parallel data DIN0(0–7) 300 to DIN15(0–7) 315 at 77.5 MHz supply sixteen respective 8-bit parallel registers 320 to 335. The sixteen 8-bit registers 320 to 335 transfer their data to respective first-in-first-out (FIFO) memories 340 to 355 in synchronism with clock 337. Sixteen busses of 8-bit parallel data from FIFO memories 340 to 355 are input to the transmit module 209 at inputs 360 to 375. parallel-to-serial unit 381 generates FIFO read-byte clocks 378 and 379. This data passes first to the parallel-to-serial converter units 381. Sixteen 1-bit streams of serial data 383 pass through data output unit 385 to output 386.

FIG. 3 also illustrates clock generator unit 398. The analog phase locked loop (APPL) 390 receives a reference clock input REFCLK 391. Usually this reference clock is generated by a crystal-controlled oscillator that is part of the ASIC chip. The crystal is an external component. Clock buffers/clock output multiplexer block 392 provides a means for deriving an output clock phase 396 selected from any one of eight clock phases 397 that are referred to as Φ0 to Φ7. Control and test circuitry 399 receives its inputs 393 from external pins of the ASIC chip.

The input data streams 360 to 375 to the transmit module 209 are asynchronous to REFCLK 391. Analog phase-locked loop 390 synchronizes the output data 386 to a multiple of REFCLK 391. As an example, the reference clock could be 77.75 MHz, and with an APLL 390 output of 622 MHz. Thus APLL 390 implements a count down ratio of 8.

ASIC technology has advanced steadily over the past years and it is now feasible to implement high performance phase locked-loops with multiple phase outputs over a wide frequency range. ASICs can now achieve eight phase clocks over a 125 MHz to 750 MHz frequency range. Analysis of APLL circuits enables reduction of jitter and distortion. In addition APLLs can be implemented at low power dissipation levels, typically less than 25 mW. Multiplication ranges of 4 to 8 are commonplace. A number of other special features have made the ASIC based APLL a formidable tool.

Figure 4:
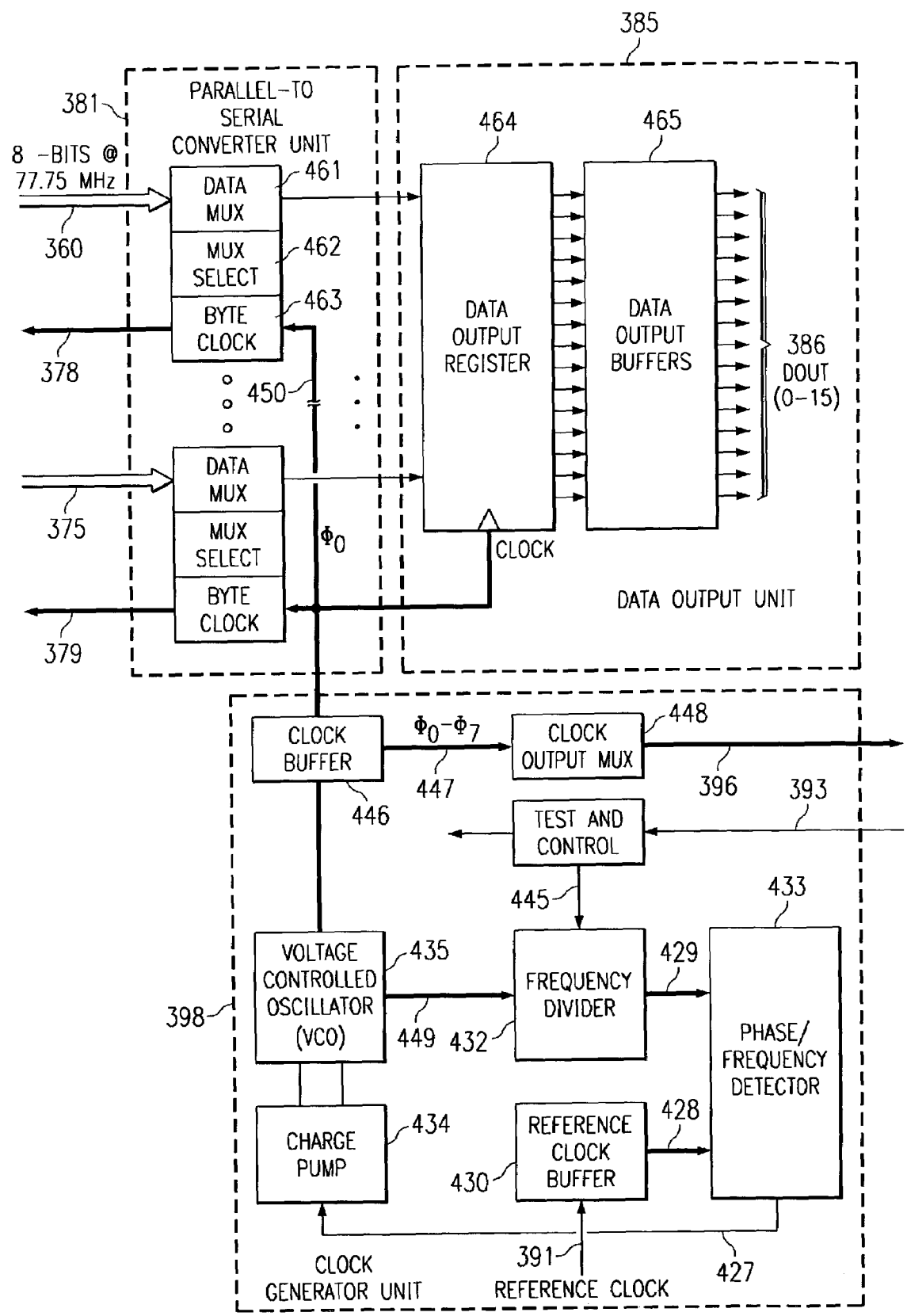
FIG. 4 illustrates the functional block diagram of the transmit module of this invention.

FIG. 4 illustrates a typical high-performance APLL configuration suitable for this application showing clock generator unit 398 in greater detail. Clock generator unit 398 is embedded in a single technology CMOS ASIC processor/transmit module which includes both high-performance clock circuitry and logic functions. Voltage-controlled oscillator (VCO) 435 has an operating frequency range of 125 MHz to 750 MHz. Output signal 449 supplies frequency divider 432. Frequency divider 432 divides by 1, 2, 4, or 8 depending on the state of control signal 445. The reference clock input 391 is passed to a buffer stage 430 and then sent as an input 428 to the phase/frequency detector circuit 433. The phase/frequency detector circuit 433 detects the phase difference between the buffered reference clock 428 and the divided version of VCO output 429 from frequency divider 432. The phase-difference signal 427 is fed to the charge pump 434 and the charge pump bias adjusts the VCO phase to achieve phase-lock between reference clock 391 and the sub-multiple frequency output 449 of VCO 435. VCO 435 supplies an output signal to clock buffer 446. Clock buffer 446 supplies the base phase signal $\Phi_0$ 450 to the respective byte clocks 463. Clock buffer 446 also supplies all eight clock phases $\Phi 0$ to $\Phi 7$ to clock output multiplexer 448 via lines 447. Clock output multiplexer 448 selects one of the eight clock phases $\Phi 0$ to $\Phi 7$ for output on line 396.

Through the use of the high performance analog phase locked-loop, the sixteen output data streams at D0 through D15 386 are synchronized to the CLKOUT signal 396. This CLKOUT signal 396 could be any one of eight phases generated in the clock generator unit 398 upon selection by clock output multiplexer 448. This allows the user to precisely adjust the phase of the output clock using control pins to the transmit module 209.

The parallel-to-serial converter unit 381 includes sixteen 3-part logic elements. Each of these sixteen 3-part logic elements contains a data multiplexer 461, a multiplex select 462 and a byte clock 463. Clock generator unit 398 provides the phase clock 450 which drives respective byte clock units 463. Each byte clock unit 463 in the preferred embodiment is a ring counter that divides the 622 MHz phase clock by eight. These byte clock units 463 produce respective read-byte clocks 378 to 379 at 77.75 MHz for FIFOs 340 to 355. Byte clock units 463 also perform the switching control function, gating on each of the eight inputs of the corresponding data multiplexer 461 in succession at a 622 MHz rate. The data multiplexer 461 acts much like a comutatator, switching in succession at a 622 MHz rate each of the eight bits of 360 to present them as inputs to one of sixteen serial-in parallel-out registers (SIPO) within the data output register block 464. The data output buffers block 465 provides the full output drive requirement for the ASIC chip. The data output pins interface to the input of an Electrical-to-Optical Converter 4:1 Multiplexer 108 which multiplexes the data up to a serial rate of 10 Gb/sec.

Power distribution is accomplished using multiple VSS and VDD feed points reducing power bus and ground bus lead length and inductance. This is of critical importance in modules designed to pass extremely high data rate signals and clock signals.

Figure 5:
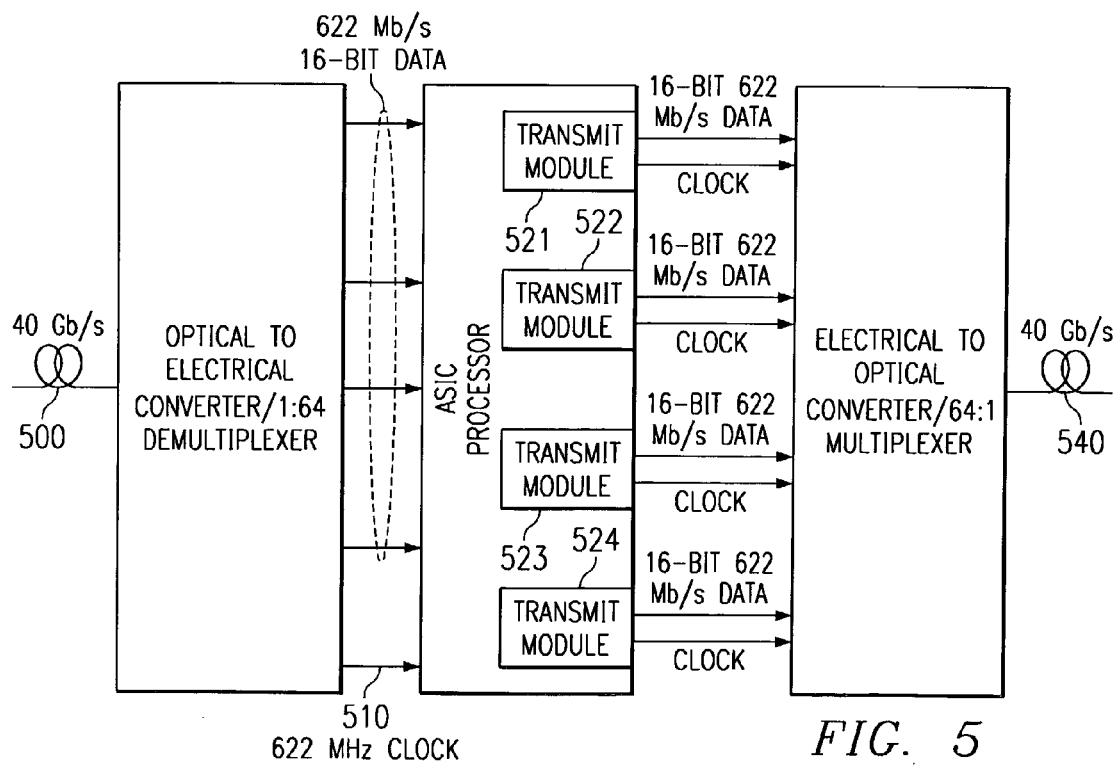
FIG. 5 illustrates several of the transmit modules of this invention linked to generate higher throughput data links.

FIG. 5 illustrates four transmit modules 521, 522, 523 and 524 linked in a second embodiment of the invention. Input data stream 500 and output data stream 540 are both at 40 Gb/s. Linking allows the four transmit modules 520, 521, 522 and 523, each functioning from a 622 MHz clock, to perform in parallel increasing throughput to 40 Gb/s. This elevates performance of the Fiber Optic serial link system to the OC-768 (40 Gb/s) standard level with integrated ASIC-CMOS technology.

The techniques of this invention make possible the following performance features. This technique uses 10 Gb/s pre-aligned parallel data links. Transmission of full baud clock with data obviates any need for clock recovery at the destination. A fixed I/O architecture minimizes cross-talk, VCC/GND bounce and data skew between channels. This technique provides a programmable clock multiplication ratio from a single PLL. The clock output phases are selectable. Finer adjustments are possible using additional phase interpolators. The fixed architecture of this technique gives repeatable performance, particularly with regard to data skew differences between channels. This technique provides low power dissipation because the PLL is shared between multiple channels. This technique enables board design flexibility.

The transmit module of this invention enables transmission of a bit rate clock. This facilitates the multiplexing of the sixteen 622Mb/s data channels without need for clock/data recovery at the receive side of the optical-to-electrical conversion module. This obviates the need for delay insertion elements on the board to align the clock to the data. In the preferred embodiment of the invention a 3-bit selection of one of eight possible phases of the analog phase-locked loop (APLL). Finer adjustments are possible by adding phase interpolators which can further sub-divide each of the eight phases into $16/32$ linear steps. This 3-bit control can be applied external to the chip to adjust the delays on the clock thereby compensating for any skew introduced by package traces, board traces with respect to the data.

This represents a clear improvement over conventional methods that often involved adjusting the delays by insertion of delay elements on the board. This conventional approach uses up very valuable area on the system board and in addition is very difficult to actually accomplish, which makes the conventional approach expensive and time consuming.

What is claimed is:

1. An optical transmitter comprising:
a predetermined plurality of parallel data inputs;
a clock generator having a reference clock input producing a plurality of output clock signals of differing phases in synchronism with the reference clock input;
a plurality of parallel to serial data converters, each coupled to a corresponding one of said parallel data inputs, each parallel to serial data converter receiving an output clock signal of a predetermined phase from said clock generator with each parallel to serial data converter receiving said output clock signal of the same predetermined phase from said clock generator, each of said parallel to serial data converters having a buffer loaded in parallel in synchronism with a read clock a predetermined fraction of said output clock signal of said predetermined phase to trigger data input and output serially in synchronism with said output clock of said predetermined phase;
a clock output multiplexer connected to said clock generator receiving said plurality of output clock signals of differing phases and outputting a selected one of said plurality of output clock signals of differing phases; and
an electrical to optical converter connected to said plurality of parallel to serial data converters and said output clock multiplexer for generating an optical signal corresponding to said output of said plurality of parallel to serial converters in synchronism with said output clock of said predetermined phase.

2. The optical transmitter of claim 1, wherein:
said clock generator includes an analog phase locked loop with a selectable division ratio.

3. An optical transmitter comprising:
a predetermined plurality of parallel data inputs;
a plurality of transmitter modules, each of said plurality of transmitter modules including
a clock generator having a reference clock input producing a plurality of output clock signals of differing phases in synchronism with the reference clock input;
a plurality of parallel to serial data converters, each coupled to a corresponding one of said parallel data inputs, each parallel to serial data converter receiving an output clock signal of a predetermined phase from said clock generator with each parallel to serial data converter receiving said output clock signal of the same predetermined phase from said clock generator, each of said parallel to serial data converters having a buffer loaded in parallel in synchronism with a read clock a predetermined fraction of said output clock signal of said predetermined phase to trigger data input and output serially in synchronism with said output clock of said predetermined phase;

a clock output multiplexer connected to said clock generator receiving said plurality of output clock signals of differing phases and outputting a selected one of said plurality of output clock signals of differing phases; and an electrical to optical converter connected to said plurality of parallel to serial data converters and said output clock multiplexer for generating an optical signal corresponding to said output of said plurality of parallel to serial converters in synchronism with said output clock of said predetermined phase.

4. The optical transmitter of claim 3, wherein:
said clock generator of each of said plurality of transmitter modules includes an analog phase locked loop with a selectable division ratio.

5. An optical repeater comprising:
an optical to electrical converter receiving an optical signal and producing a predetermined plurality of parallel electrical signals at a predetermined data rate;
a clock generator having a reference clock input producing a plurality of output clock signals of differing phases in synchronism with the reference clock input;
a plurality of parallel to serial data converters, each receiving a corresponding one of said parallel electrical signals, each parallel to serial data converter receiving an output clock signal of a predetermined phase from said clock generator with each parallel to serial data converter receiving said output clock signal of the same predetermined phase from said clock generator, each of said parallel to serial data converters having a buffer loaded in parallel in synchronism with a read clock a predetermined fraction of said output clock signal of said predetermined phase to trigger data input and output serially in synchronism with said output clock of said predetermined phase;
a clock output multiplexer connected to said clock generator receiving said plurality of output clock signals of differing phases and outputting a selected one of said plurality of output clock signals of differing phases; and
an electrical to optical converter connected to said plurality of parallel to serial data converters of each of said of said plurality of transmitter modules and said output clock multiplexer of each of said of said plurality of transmitter modules for generating an optical signal corresponding to said output of said plurality of parallel to serial converters in synchronism with said output clock of said predetermined phase.

6. The optical repeater of claim 5, wherein:
said clock generator includes an analog phase locked loop with a selectable division ratio.

7. The optical repeater of claim 5, further comprising:
an error detection/correction unit receiving said predetermined plurality of parallel electrical signals from said optical to electrical converter and supplying corresponding corrected electrical signals to said plurality of parallel to serial data converters.

8. An optical repeater comprising:
an optical to electrical converter receiving an optical signal and producing a predetermined plurality of parallel electrical signals at a predetermined data rate;
a plurality of transmitter modules, each of said plurality of transmitter modules including
a clock generator having a reference clock input producing a plurality of output clock signals of differing phases in synchronism with the reference clock input;
a plurality of parallel to serial data converters, each receiving a corresponding one of said parallel electrical signals, each parallel to serial data converter receiving an output clock signal of a predetermined phase from said clock generator with each parallel to serial data converter receiving said output clock signal of the same predetermined phase from said clock generator, each of said parallel to serial data converters having a buffer loaded in parallel in synchronism with a read clock a predetermined fraction of said output clock signal of said predetermined phase to trigger data input and output serially in synchronism with said output clock of said predetermined phase;
a clock output multiplexer connected to said clock generator receiving said plurality of output clock signals of differing phases and outputting a selected one of said plurality of output clock signals of differing phases; and
an electrical to optical converter connected to said plurality of parallel to serial data converters of each of said of said plurality of transmitter modules and said output clock multiplexer of each of said of said plurality of transmitter modules for generating an optical signal corresponding to said output of said plurality of parallel to serial converters in synchronism with said output clock of said predetermined phase.

9. The optical repeater of claim 8, wherein:
said clock generator of each of said of said plurality of transmitter modules includes an analog phase locked loop with a selectable division ratio.

10. The optical repeater of claim 8, wherein:
each of said plurality of transmitter modules further includes an error detection/correction unit receiving said predetermined plurality of parallel electrical signals from said optical to electrical converter and supplying corresponding corrected electrical signals to said plurality of parallel to serial data converters.

* * * * *